(12) United States Patent
Bickel et al.

(10) Patent No.: US 7,326,596 B2
(45) Date of Patent: Feb. 5, 2008

(54) HIGH VOLTAGE POWER DEVICE WITH LOW DIFFUSION PIPE RESISTANCE

(75) Inventors: Markus Bickel, Kleinniedesheim (DE); Ulrich Kelberlau, Lampertheim (DE)

(73) Assignee: IXYS Corporation, Santa Clara, CA (US)

( * ) Notice: Subject to any disclaimer, the term of this patent is extended or adjusted under 35 U.S.C. 154(b) by 344 days.

(21) Appl. No.: 11/112,408

(22) Filed: Apr. 22, 2005

(65) Prior Publication Data

US 2005/0239259 A1    Oct. 27, 2005

Related U.S. Application Data

(60) Provisional application No. 60/565,685, filed on Apr. 26, 2004.

(51) Int. Cl.
*H01L 21/332* (2006.01)
(52) U.S. Cl. ............... 438/140; 438/560; 257/E21.388
(58) Field of Classification Search ............... 438/135, 438/140, 529, 119; 257/E21.382, E21.388
See application file for complete search history.

(56) References Cited

U.S. PATENT DOCUMENTS

| 4,672,415 A | 6/1987 | Berndes et al. |
| 5,798,287 A * | 8/1998 | Ronsisvalle ............... 438/133 |
| 5,851,857 A * | 12/1998 | Kelberlau et al. ........... 438/134 |

FOREIGN PATENT DOCUMENTS

| GB | 1 499 845 | 2/1978 |
| GB | 1 536 545 | 12/1978 |

* cited by examiner

*Primary Examiner*—Chandra Chaudhari
(74) *Attorney, Agent, or Firm*—Townsend and Townsend and Crew LLP

(57) ABSTRACT

A method for forming a high voltage semiconductor power device comprises providing a first dopant source of first conductivity on an upper surface of a substrate of second conductivity. A second dopant source of first conductivity is provided on a lower surface of the substrate. The substrate is annealed for a first given time to drive the dopants from the first and second dopants sources into the substrate. The first and second dopant sources are removed from the upper and lower surfaces of the substrate. The substrate is annealed for a second given time to homogenize dopant concentration within the substrate after the first and second dopant sources have been removed, where the annealing the substrate for the second given time results in out-diffusion of dopants proximate the upper and lower surfaces of the substrate. Compensation dopants are provided into the substrate after annealing the substrate for the second given time to compensate the out-diffusion of the dopants proximate the upper and lower surfaces. The dopants driven into the substrate define an isolation diffusion structure that extends from the upper surface to the lower surface.

15 Claims, 4 Drawing Sheets

HIGH VOLTAGE POWER DEVICE WITH LOW DIFFUSION PIPE RESISTANCE

CROSS-REFERENCES TO RELATED APPLICATIONS

This application claims priority to U.S. Provisional Patent Application No. 60/565,685, filed on Apr. 26, 2004, which is incorporated herein by reference for all purposes.

BACKGROUND OF THE INVENTION

The present invention relates to power devices, and in particular high voltage diodes, transistors, power MOSFETs, IGBTs, thyristors, MCTs, and the like ("power devices").

High voltage power devices are fabricated by semiconductor processing techniques on a single crystalline semiconductor substrate, such as a silicon wafer. Conventional semiconductor processing techniques include doping and implanting, lithography, diffusion, chemical vapor deposition (CVD), wet and dry etching, sputtering, epitaxy, and oxidizing. A complex sequence of these processing techniques is required to produce the conventional power devices having a high breakdown voltage.

In conventional power devices, e.g., thyristors and diodes, an aluminum (Al), separation diffusion process is used to connect the backside of a die of to the top surface of the die. These vertical separation diffusion structures are referred to as "pipes" or "sinkers." Electrically it connects the potential of the back surface to the top surface areas of the die whereon the aluminum diffusion regions are defined. By using this technique it is possible to define the potential of these regions. For example, this technique makes it possible to obtain high breakdown voltages for the devices, especially in a planar manufacturing method. These aluminum diffusion regions are preferably located at the edges of the die to provide a given potential condition at these scribe regions whereon dicing would be performed.

These aluminum diffusion regions are formed by making patterned aluminum structures on both sides of the wafer or substrate for use as diffusion sources in a high temperature diffusion process. The two diffusion fronts or regions (from top and backside) meet each other approximately in the middle of the wafer thickness. This merged aluminum region generally has a relatively high resistance due to the low aluminum concentration at its center.

SUMMARY OF THE INVENTION

According to embodiments of the present invention, a high voltage power device has a scribe diffusion structure that is configured to carry current. As used herein, the terms "vertical diffusion region," "isolation diffusion region," "isolation diffusion structure," "diffusion pipe," "pipe," and "sinker" are also used to refer to the scribe diffusion structure. These terms are used interchangeably.

In one embodiment, a method for forming a high voltage semiconductor power device comprises providing a first dopant source of first conductivity on an upper surface of a substrate of second conductivity. A second dopant source of first conductivity is provided on a lower surface of the substrate. The substrate is annealed for a first given time to drive the dopants from the first and second dopants sources into the substrate. The first and second dopant sources are removed from the upper and lower surfaces of the substrate. The substrate is annealed for a second given time to homogenize dopant concentration within the substrate after the first and second dopant sources have been removed, where the annealing the substrate for the second given time results in out-diffusion of dopants proximate the upper and lower surfaces of the substrate. Compensation dopants are provided into the substrate after annealing the substrate for the second given time to compensate the out-diffusion of the dopants proximate the upper and lower surfaces. The dopants driven into the substrate define an isolation diffusion structure that extends from the upper surface to the lower surface.

The isolation diffusion structure is has a resistance value of about 20 mOhms to 2 Ohms, e.g., no more than 50 mOhms, or no more than 100 mOhms, or no more than 200 mOhms, or no more than 300 mOhms according to applications. In one implementation, the isolation diffusion structure is configured to provide a low resistance current path between a first electrode on the upper surface of the substrate and a second electrode on the lower surface of the substrate, the isolation diffusion structure being configured to handle at least 10 amperes and no more than 200 mOhms.

In another embodiment, a method for forming a high voltage semiconductor power device comprises providing a first aluminum source on an upper surface of a silicon substrate; providing a second aluminum source on a lower surface of the substrate; annealing the substrate for a first given time to drive aluminum atoms from the first and second aluminum sources into the substrate; removing the first and second aluminum sources from the upper and lower surfaces of the substrate; annealing the substrate for a second given time to homogenize aluminum concentration within the substrate after the first and second aluminum sources have been removed, where the annealing the substrate for the second given time results in out-diffusion of aluminum atoms proximate the upper and lower surfaces of the substrate; and providing compensation dopants into the substrate after annealing the substrate for the second given time to compensate the aluminum out-diffusion. The aluminum atoms driven into the substrate define an isolation diffusion structure that extends from the upper surface to the lower surface. The isolation diffusion structure has a sufficiently low resistance to provide a current path between a first electrode on the upper surface of the substrate and a second electrode on the lower surface of the substrate.

DESCRIPTION OF THE SPECIFIC EMBODIMENTS

The present invention relates to high voltage power devices having pipes or isolation diffusion structures that are configured to carry current. Embodiments of the present invention are directed to high voltage power devices, e.g., thyristor and diodes, that are configured for use in flip chip applications. A high voltage power device is generally configured to handle about 600 volts or more, e.g., 1000 volts or more. In one embodiment, a high voltage power device is configured to handle 1000-2000 volts.

Figure 1:
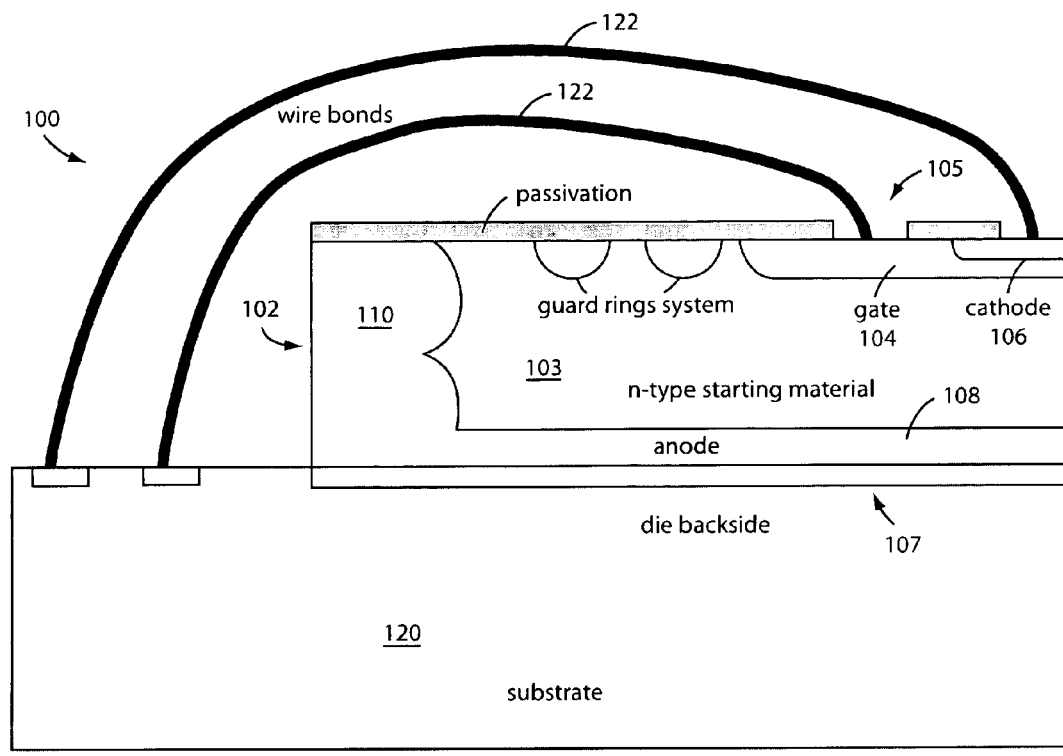
FIG. 1 illustrates a cross-sectional view of a high voltage power device in a wire bonded application.

FIG. 1 illustrates a module 100 including a high voltage power device 102 that is used in a wire-bonded application. The power device 102 includes a gate 104 and a cathode 106 that are provided on a front side 105 of its die or substrate 103. An anode 108 is provided on a backside 107 of the power device. An isolation diffusion structure 110 extends vertically from the front to the back and has an opposite conductivity than the substrate 103. That is, the substrate 103 is an n-type material and the structure 110 is a p-type material.

The isolation diffusion structure is formed by diffusing aluminum from the top and bottom of the substrate 103 at high temperature for an extended time, e.g., 2-3 days depending on the thickness of the substrate. A portion of a substrate 120 couples the gate 104 and cathode 106 of the power device using wire bonds 122. Another portion of the substrate 120 couples the anode 108 of the power device. The wire bonds 122 provide conductive paths between the anode and cathode. Accordingly, the isolation diffusion structure is not used to provide a current path between the anode and cathode and has a relatively high resistance due to low dopant concentration at its center.

Figure 2:
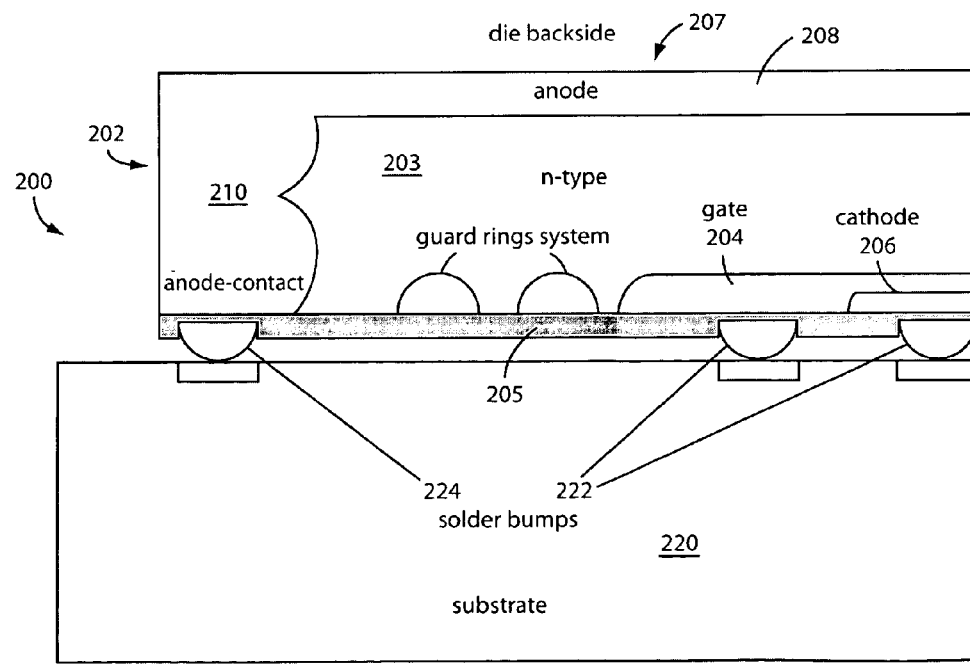
FIG. 2 illustrates a cross-sectional view of a high voltage power device in a flip chip application according to one embodiment of the present invention.

FIG. 2 illustrates a module 200 including a high voltage power device 202 that is used in a flip chip application according to one embodiment of the present invention. The power device 202 includes a gate 204 and a cathode 206 that are provided on an upper side 205 of its die or substrate 203. The substrate 203 is of a first conductivity, e.g., n-type. An anode 208 is provided on a backside 207 of the power device. The power device 202 is flipped to have its front side contact (or be proximate) a substrate 220. Solder bumps of first type 222 couples the gate 204 and cathode 206 of the power device to a first portion of the substrate 220. One or more solder bumps of second type 224 couple the anode 208 to a second portion of the substrate 220 via an isolation diffusion structure 210, which is of a second conductivity, e.g., p-type.

In one implementation, the isolation diffusion structure 210 is formed by diffusing p-type dopants into the substrate 203 from the front and backside of the substrate. The p-type dopants include aluminum and boron. The isolation structure 203 may comprise primarily aluminum, or both aluminum and boron, according to applications. In other implementations, the structure 203 may comprise other p-type dopants.

In the present embodiment, the isolation diffusion structure 210 is configured to have low resistance and is configured to provide a current path between the anode and cathode. For example, for a die or thyristor rated for 10A and 1600V (with voltage drop of 2V), the pipe resistance is provided to be about 200 mOhms, which is at least 20 times lower than the resistance of the conventional pipe 110. The current flowing through the isolation diffusion structure is from 0.1 A to 100 A in typical high voltage applications. In one embodiment, the isolation diffusion structure 210 is configured to handle 10 A or more. The conventional isolation diffusion structure or pipe 110, on the other hand, is not configured to provide a low resistance current path. It has relatively high resistance and is unsuitable generally for the flip chip application due its low dopant concentration level at the center of the pipe 110.

One method of forming the isolation diffusion structure 210 having sufficiently low resistance is to increase the aluminum diffusion time, so that more aluminum atoms diffuse deeper into the substrate. However, this causes surface defects resulting from evaporated aluminum. Another method is to use a boron diffusion step after the aluminum diffusion step. This method reduces the surface contact resistance. Yet another method would be to increase the surface area of the diffusion pipe or reduce the die thickness.

According to one embodiment, the isolation diffusion structure 210 having low resistance and suitable for use in a flip chip application is formed using a two-step aluminum diffusion process that is followed by a compensation process. To perform the first aluminum diffusion step, aluminum structures are formed on the top and bottom of the substrate and diffuses aluminum into the substrate from both sides of the substrate for a given time. This duration should be sufficiently long to inject substantial amount of aluminum into the substrate but not long enough to cause significant aluminum contamination on the substrate surface in the center area of a die. The aluminum structures on the top and bottom are removed from the substrate after the first diffusion step.

Thereafter, as a second aluminum diffusion step, the substrate is annealed for a given time again to homogenize the aluminum concentration. The substrate can be annealed for an extended time without concern for aluminum contamination since the aluminum structures have been removed prior to the second diffusion step.

Figure 10A:
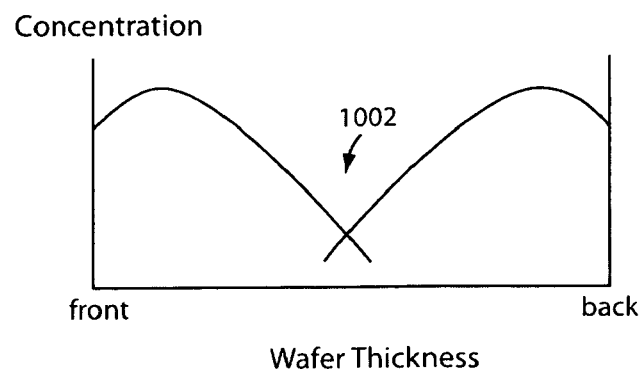
FIG. 10A illustrates an aluminum concentration profile for an isolation diffusion structure after the first aluminum diffusion step of FIG. 5.

After the first aluminum diffusion step, the aluminum concentration profile of the resulting isolation diffusion structure is similar to the conventional isolation diffusion structure 110, where the aluminum concentration is high proximate the upper and lower surfaces of the substrate 203 but low at the middle (see FIG. 10A). After the second aluminum diffusion step, the middle of the isolation diffusion structure has a much higher concentration of aluminum. However, the out-diffusion occurs proximate the upper and lower surfaces of the substrate 203 (see FIG. 10B). The isolation diffusion structure continues to have a relatively high resistance as a result. Accordingly, a third diffusion step or compensation step is carried out to compensate for the aluminum out-diffusion (see FIG. 10C). The resulting isolation diffusion structure has relatively high dopant concentration in its entirety and is configured to provide a current path with low resistance, e.g., for use in a flip chip application.

In the present embodiment, boron is diffused into the substrate from the upper and lower surfaces as part of the third diffusion step. In other embodiments, aluminum may be used for the third diffusion step. The third step does not necessary have to be a diffusion step; i.e., it may use an implantation step.

Figure 3:
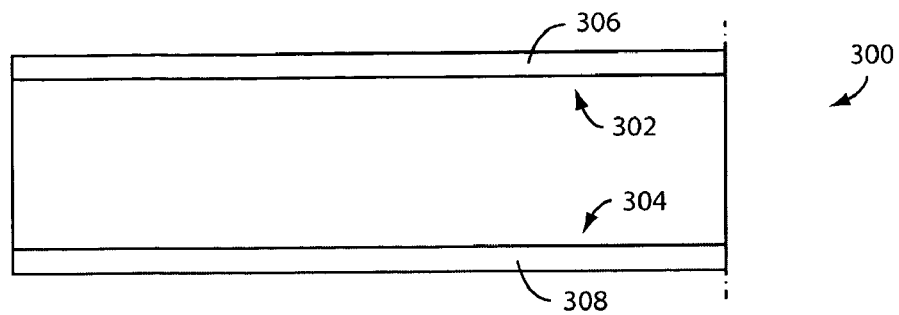
FIG. 3 illustrates a cross-sectional view of the semiconductor substrate with aluminum layers provided on the upper and lower surfaces according to one embodiment of the present invention.

FIGS. 3-9 illustrate a method for fabricating for a power device having a low-resistance isolation diffusion structure (or pipe) according to one embodiment of the present invention. A semiconductor substrate 300, e.g., an n-type silicon substrate, having front and back sides 302 and 304, is provided (FIG. 3). In one embodiment, the substrate 300 includes an n-type impurity, such as phosphorous or the like, at a concentration ranging from about $10^{13}$ atoms/cm$_3$ to about $10^{16}$ atoms/cm$_3$ to provide blocking voltages up to 2000 volts. Generally, higher blocking voltages may be obtained for lower concentration levels. Accordingly, other concentration levels may be used depending on the particular application.

An upper aluminum layer 306 and a lower aluminum layer 308 are formed on the front and back sides of the substrate using an evaporation method. These layers are used to provide dopants for the diffusion pipe to be formed. In the present embodiment, the aluminum layer are deposited by placing the substrate 300 in a substantially vacuum chamber having an aluminum source. The aluminum source is heated with an electron gun to evaporate the aluminum atoms from the source and have them deposit on the front and back sides of the substrate. In another embodiment, a sputtering method is used to deposit the aluminum layers. Also, other types of layers may be used, e.g., boron layers.

Figure 4:
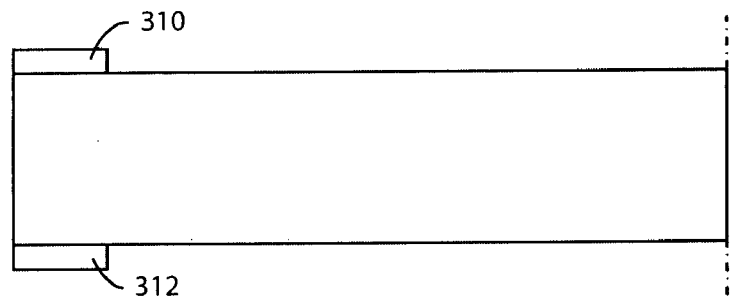
FIG. 4 illustrates a cross-sectional view of the semiconductor substrate with a patterned aluminum structures to serve as aluminum sources for formation of an isolation diffusion structure according to one embodiment of the present invention.

Aluminum layers 306 and 308 are patterned to provide an upper aluminum structure 310 and a lower aluminum structure 312 using a photolithography method (FIG. 4). These structures lie directly above and below wherein the low-resistance diffusion pipe structure is to be formed (i.e., vertically aligned to a scribe area wherein the diffusion pipe structure is to be formed). Although not illustrated, these structures 310 and 312 are formed at a plurality of locations on the substrate since each die from the substrate 300 has a diffusion pipe structure that envelopes around the die edge.

Patterning of the aluminum layers involves forming a photoresist layer on each of the aluminum layers and then selectively removing the photoresist layer, except that which directly overlies the scribe area. Consequently, portions of the aluminum layers that directly overlie the scribe areas remain covered while other parts of the aluminum layers are exposed. These exposed portions of the aluminum layers are etched away. Subsequently, the remaining photoresist layer is removed. The resulting structures are the aluminum structures 310 and 312.

Figure 5:
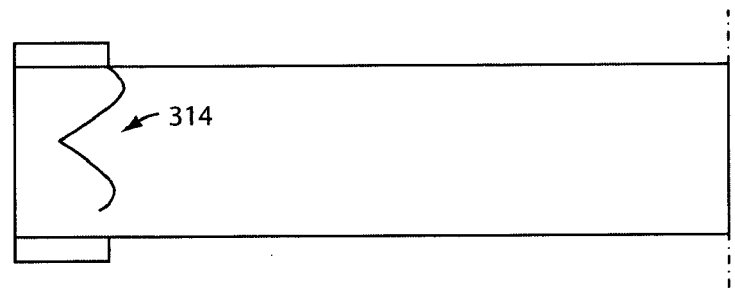
FIG. 5 illustrates a cross-sectional view of the semiconductor substrate after performing a first aluminum diffusion step according to one embodiment of the present invention.
Figure 6:
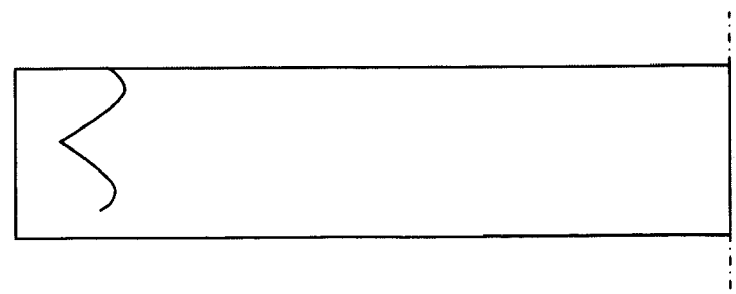
FIG. 6 illustrates a cross-sectional view of the semiconductor substrate after aluminum sources are removed according to one embodiment of the present invention.

The substrate 300 is placed within a furnace to drive the aluminum into the substrate to form a separation diffusion pipe 314 (FIG. 5). The diffusion pipe is a continuous P type "frame". This first aluminum separation diffusion step involves annealing the substrate for about 40 hours in a nitrogen atmosphere (with a small percentage of oxygen) at 1250° Celsius. The substrate is then annealed in an oxygen environment for about 10 hours at 1250° Celsius. Thereafter, the aluminum structures or sources 310 and 312 are removed (FIG. 6).

FIG. 10A illustrates a qualitative aluminum concentration of the diffusion pipe after the first diffusion step. The Al concentrations are high proximate the front and back sides of the substrate. However, the concentration is low at the middle 1002 of the diffusion pipe, which would cause the diffusion pipe to have a relatively high resistance. This would hinder its use in a flip chip application since the diffusion pipe with a high resistance could not be effectively used to carry current in such an application (see FIG. 2).

Figure 7:
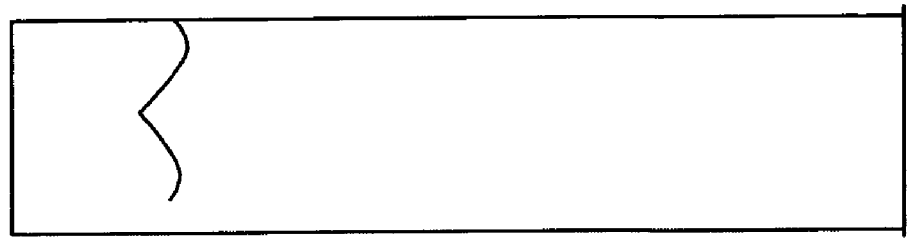
FIG. 7 illustrates a cross-sectional view of the semiconductor substrate after performing a second aluminum diffusion step according to one embodiment of the present invention.

Referring to FIG. 7, the substrate 300 is placed in a furnace after the aluminum sources have been removed to perform a second aluminum separation diffusion step. The substrate is annealed in a nitrogen environment (with a small percentage of oxygen) for about 20 hours at 1250° Celsius, and then annealed in an oxygen environment for about 10 hours at 1250° Celsius. The second diffusion step is to homogenize the aluminum concentration and remove the high resistance area at the middle of the separation diffusion pipe.

Figure 10B:
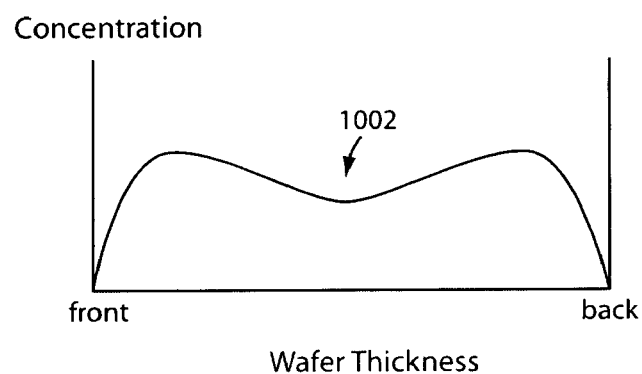
FIG. 10B illustrates an aluminum concentration profile for the isolation diffusion structure after the second aluminum diffusion step of FIG. 7.

FIG. 10B illustrates a qualitative aluminum concentration of the diffusion pipe after the second diffusion step. As shown, the aluminum is more evenly distributed through the diffusion pipe. In particular, the concentration level at the middle part 1002 of the pipe has increased significantly from the first diffusion step (see FIG. 10A). However, the concentration levels proximate the front and back sides of the substrates have decreased significantly due to out-diffusion of aluminum. Left alone, these areas would cause the diffusion pipe to have a high resistance that would again hinder its use in a flip chip application.

Figure 8:
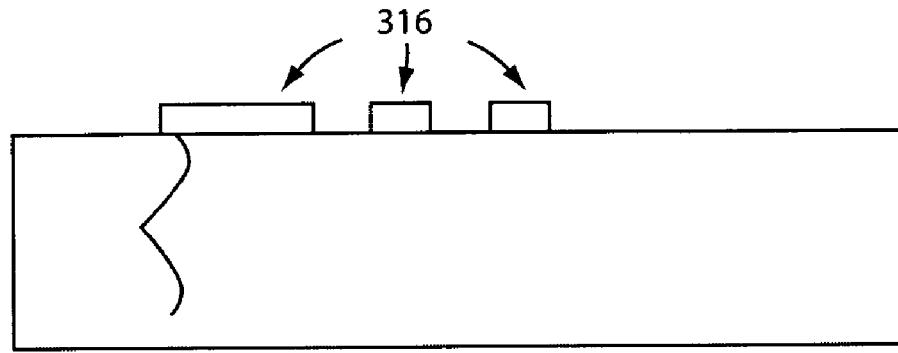
FIG. 8 illustrates a cross-sectional view of the semiconductor substrate having a patterned mask layer for a compensation diffusion process according to one embodiment of the present invention.
Figure 9:
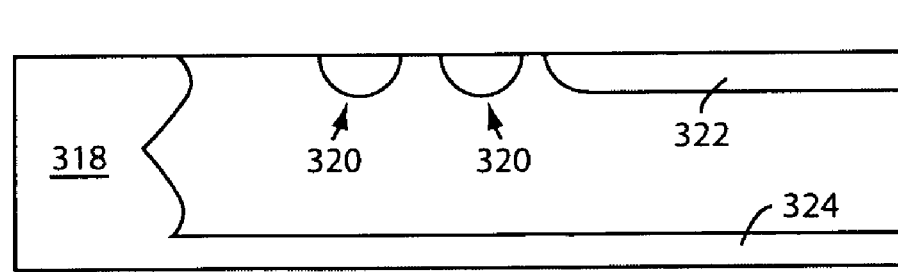
FIG. 9 illustrates a cross-sectional view of the semiconductor substrate after performing the compensation diffusion step according to one embodiment of the present invention.

Referring to FIGS. 8 and 9, a third diffusion step (or compensation diffusion step) is performed to compensate the aluminum out-diffusion at the front and back sides. A mask layer 316 is formed over the front side of the substrate and then patterned to expose the areas wherein boron is to be provided (FIG. 8). In one implementation, a boron compound, e.g., $B_2O_3$, is spun onto the substrate and the patterned mask layer. The substrate is then placed in a furnace for about 105 hours at 1200°. A separation diffusion pipe 318 with low resistance, one or more guard rings 320, an emitter region 322, and an anode region 324 are formed upon completion of the third diffusion step (FIG. 9). The surface concentration of boron is about $10^{17}$ atoms/cm$^3$ to $10^{19}$ atoms/cm$^3$. Thereafter, the substrate is further processed to produce a diode, thyristor, or other types of power devices as desired.

In the present embodiment, boron is used as the compensation dopant, so that the third diffusion step can be integrated into the current p-region formation step and reduce one or more fabrication steps. However, other dopants, including aluminum may be used in other implementations.

Figure 10C:
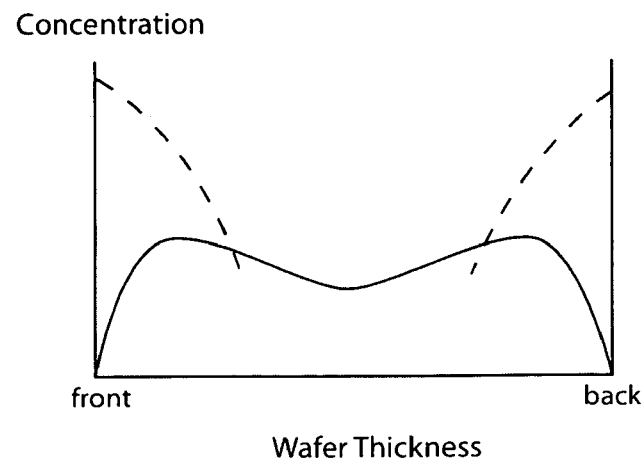
FIG. 10C illustrates an aluminum concentration profile for the isolation diffusion structure after the compensation diffusion step of FIG. 9.

FIG. 10C illustrates a qualitative boron concentration of the separation diffusion pipe 318 after the third compensation diffusion step. Boron atoms are diffused into the front and back sides of the substrate to compensate the out-diffusion of aluminum at those locations, so that the resulting diffusion pipe is provided with sufficiently low-resistance to be used in a flip chip application to carry current.

While the above is a full description of the specific embodiments, various modifications, alternative constructions, and equivalents may be used. For example, although the first, second, and third diffusion steps all use annealing steps, an ion implantation step may be used for one or more steps. Furthermore, while the power device with a low-resistance diffusion pipe is described as being used in a flip chip application, such a power device can be used in other suitable non-flip-chip application. Therefore, the above description and illustrations should not be taken as limiting the scope of the present invention, which is defined by the appended claims.

What is claimed is:

1. A method for forming a high voltage semiconductor power device, comprising:
   providing a first dopant source of first conductivity on an upper surface of a substrate of second conductivity;
   providing a second dopant source of first conductivity on a lower surface of the substrate;
   annealing the substrate for a first given time to drive the dopants from the first and second dopants sources into the substrate;
   removing the first and second dopant sources from the upper and lower surfaces of the substrate;
   annealing the substrate for a second given time to homogenize dopant concentration within the substrate after the first and second dopant sources have been removed, the annealing the substrate for the second given time resulting in out-diffusion of dopants proximate the upper and lower surfaces of the substrate; and
   providing compensation dopants into the substrate after annealing the substrate for the second given time to compensate the out-diffusion of the dopants proximate the upper and lower surfaces,
   wherein the dopants driven into the substrate to define an isolation diffusion structure that extends from the upper surface to the lower surface.

2. The method of claim 1, wherein the first dopant source includes aluminum.

3. The method of claim 2, wherein the second dopant source includes aluminum.

4. The method of claim 2, wherein the isolation diffusion structure is configured to be used in a flip chip application and carry current.

5. The method of claim 4, wherein the isolation diffusion structure is configured to provide a low resistance current path between a first electrode on the upper surface of the substrate and a second electrode on the lower surface of the substrate.

6. The method of claim 1, wherein the compensation dopants include boron.

7. The method of claim 6, wherein the compensation dopants are provided by diffusing the compensation dopants into the substrate.

8. The method of claim 6, wherein the compensation dopants are provided using an implantation technique.

9. The method of claim 1, wherein the power device is a thyristor or diode that is configured to be used in a flip chip application.

10. The method of claim 1, wherein the power device is configured to handle at least 600 volts.

11. The method of claim 1, wherein the isolation diffusion structure has a resistance value between 20 mOhms to 2 Ohms.

12. The method of claim 1, wherein the power device is configured to handle at least 1000 volts.

13. The method of claim 1, wherein the isolation diffusion structure is configured to provide a low resistance current path between a first electrode on the upper surface of the substrate and a second electrode on the lower surface of the substrate, the isolation diffusion structure being configured to handle at least 10 amperes.

14. A method for forming a high voltage semiconductor power device, comprising:
   providing a first aluminum source on an upper surface of a silicon substrate;
   providing a second aluminum source on a lower surface of the substrate;
   annealing the substrate for a first given time to drive aluminum atoms from the first and second aluminum sources into the substrate;
   removing the first and second aluminum sources from the upper and lower surfaces of the substrate;
   annealing the substrate for a second given time to homogenize aluminum concentration within the substrate after the first and second aluminum sources have been removed, where the annealing the substrate for the second given time results in out-diffusion of aluminum atoms proximate the upper and lower surfaces of the substrate; and
   providing compensation dopants into the substrate after annealing the substrate for the second given time to compensate the aluminum out-diffusion,
   wherein the aluminum atoms driven into the substrate to define an isolation diffusion structure that extends from the upper surface to the lower surface, and
   wherein the isolation diffusion structure has a sufficiently low resistance to provide a current path between a first electrode on the upper surface of the substrate and a second electrode on the lower surface of the substrate.

15. The method of claim 14, wherein the compensation dopants comprise boron or aluminum.

* * * * *